(12) United States Patent
Gallivan et al.

(10) Patent No.: US 7,498,549 B2
(45) Date of Patent: Mar. 3, 2009

(54) SELECTIVE LAYER MILLIMETER-WAVE SURFACE-HEATING SYSTEM AND METHOD

(75) Inventors: James R. Gallivan, Pomona, CA (US); Kenneth W. Brown, Yucaipa, CA (US)

(73) Assignee: Raytheon Company, Waltham, MA (US)

( * ) Notice: Subject to any disclaimer, the term of this patent is extended or adjusted under 35 U.S.C. 154(b) by 686 days.

(21) Appl. No.: 10/693,125

(22) Filed: Oct. 24, 2003

(65) Prior Publication Data

US 2005/0087529 A1 Apr. 28, 2005

(51) Int. Cl.
*H05B 6/74* (2006.01)
(52) U.S. Cl. .................... 219/748; 219/745
(58) Field of Classification Search ............ 219/648, 219/647, 600, 620, 623, 677, 704, 748, 749, 219/745, 678, 746, 747; 343/700 R
See application file for complete search history.

(56) References Cited

U.S. PATENT DOCUMENTS

| 3,854,022 | A | * | 12/1974 | Moore ...................... 219/704 |
| 4,756,765 | A |   | 7/1988  | Woodroffe |
| 5,101,086 | A | * | 3/1992  | Dion et al. ................. 219/632 |
| 5,268,548 | A |   | 12/1993 | Kumar |
| 5,886,671 | A | * | 3/1999  | Riemer et al. ............. 343/776 |
| 6,169,277 | B1|   | 1/2001  | Feher et al. |
| 6,353,706 | B1| * | 3/2002  | Bridges ..................... 392/306 |
| 6,572,830 | B1| * | 6/2003  | Burdon et al. ........ 422/186.29 |
| 6,765,535 | B1| * | 7/2004  | Brown et al. ......... 343/700 MS |
| 6,872,927 | B2| * | 3/2005  | Geisler et al. .............. 219/700 |
| 2003/0052230 | A1 |   | 3/2003 | Feher |

FOREIGN PATENT DOCUMENTS

| DE | 1097594 | 1/1961 |
| JP | 2001135473 | 5/2001 |

* cited by examiner

*Primary Examiner*—Daniel L Robinson
(74) *Attorney, Agent, or Firm*—Schwegman, Lundberg & Woessner, P.A.; Gregory J. Gorrie

(57) ABSTRACT

A surface-heating system heats a surface with a high-power wavefront at a millimeter-wave frequency. The high-power wavefront may be a collimated wavefront or a converging or diverging wavefront. In some embodiments, the system includes a frequency generator to generate a lower-power millimeter-wave frequency signal, and an active-array antenna system to amplify the millimeter-wave frequency and generate the high-power wavefront in a direction of a surface for heating the surface. In other embodiments, a frequency generator and power amplifier may generate a high-power power millimeter-wave frequency signal, and a passive-array antenna system may provide the high-power wavefront in a direction of the surface. In some embodiments, a thermal-sensing subsystem may measure the surface temperature and generate a control signal to maintain the surface temperature within a predetermined temperature range.

14 Claims, 6 Drawing Sheets

SELECTIVE LAYER MILLIMETER-WAVE SURFACE-HEATING SYSTEM AND METHOD

TECHNICAL FIELD

Embodiments of the present invention pertain to heating systems and methods, and in particular, to surface-heating systems and methods that use RF energy for heating surfaces.

BACKGROUND

Conventional heating techniques typically rely on infrared (IR) energy, convective heat, or microwave energy to heat items or cook food. One problem with the use IR or convective energy is that while it takes time to penetrate a surface, to speed up the heating process the surface may become overheated or burned. One problem with the use of microwave energy is that an item may be overheated below the surface even though the surface does not brown. As can be seen, it is difficult to control the surface temperature and the subsurface temperature with either conventional IR heating techniques and/or conventional microwave heating techniques.

Some conventional heating techniques use lasers to heat a surface. One problem with the use of lasers is that they do not penetrate the surface sufficiently for many surface-heating applications. Furthermore, lasers are not very efficient having a power conversion efficiency of about ten-percent and thus not practical for industrial applications or applications where the size of the power supply is important.

Thus there are general needs for systems and methods for improved surface heating. There are also needs for more efficient surface-heating systems and methods.

SUMMARY

A surface-heating system heats a surface with a high-power wavefront at a millimeter-wave frequency. The high-power wavefront may be a collimated wavefront or a converging or diverging wavefront. In some embodiments, the system includes a frequency generator to generate a lower-power millimeter-wave frequency signal, and an active-array antenna system to amplify the millimeter-wave frequency and generate the high-power wavefront in a direction of a surface for heating the surface. In other embodiments, a frequency generator and power amplifier may generate a high-power power millimeter-wave frequency signal, and a passive-array antenna system may provide the high-power wavefront in a direction of the surface. In some embodiments, a thermal-sensing subsystem may measure the surface temperature and generate a control signal to maintain the surface temperature within a predetermined temperature range.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims.

Figure 1:
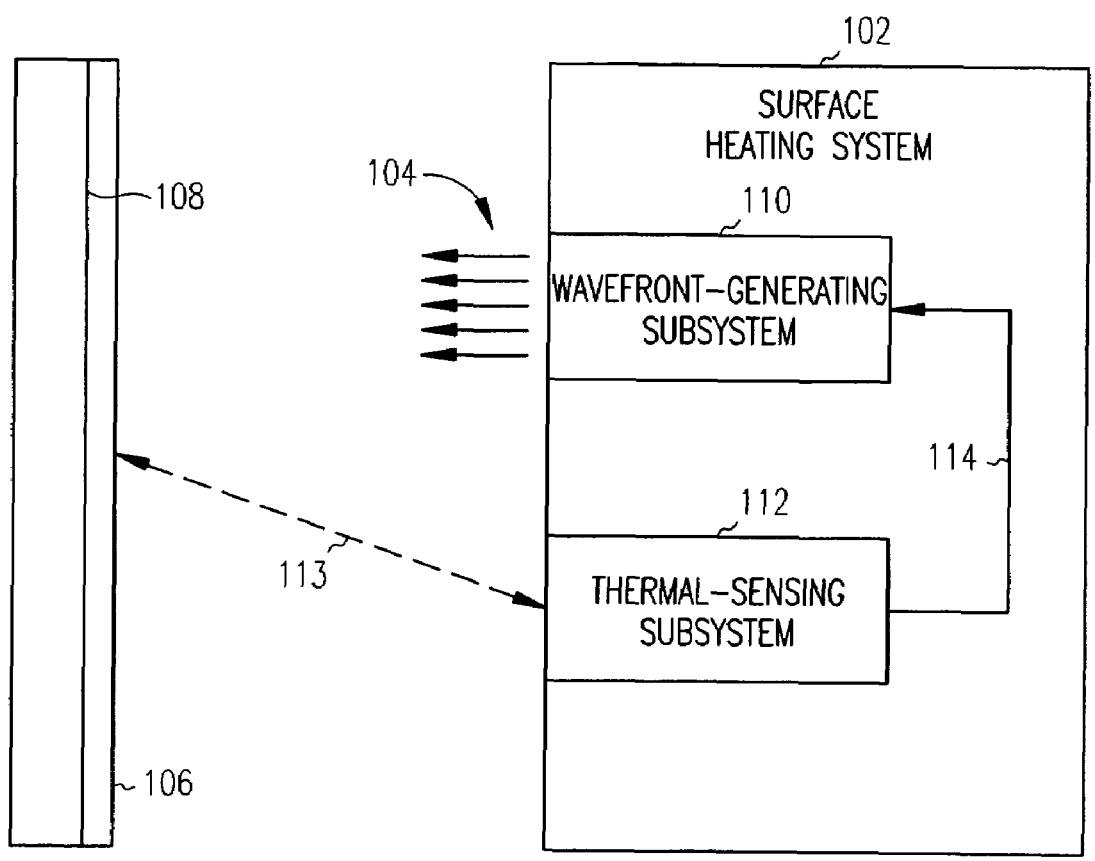
FIG. 1 illustrates an operational environment and surface-heating system in accordance with some embodiments of the present invention.

FIG. 1 illustrates an operational environment and surface-heating system in accordance with some embodiments of the present invention. Surface-heating system 102 provides high-power wavefront 104 at a millimeter-wave frequency to heat surface 106. High-power wavefront 104 may increase a surface temperature of surface 106 penetrating to within surface depth 108.

In some embodiments, high-power wavefront 104 may be a high-power collimated wavefront in which millimeter-wave energy is substantially provided in a cylindrical-type shape. In this embodiment, the millimeter-wave energy may be substantially uniform in planes parallel to surface 106. In other embodiments, high-power wavefront 104 may be a high-power wavefront in which the millimeter-wave energy is substantially provided in a converging conical shape. In this embodiment, the millimeter-wave energy density may increase toward the apex of a cone, which may be at or near surface 106. The millimeter-wave wavefront characteristics may depend on the particular antenna system selected for use by surface-heating system 102. These embodiments are described in more detail below.

In some embodiments, surface-heating system 102 includes wavefront-generating subsystem 110 to generate high-power wavefront 104 at a millimeter-wave frequency and thermal-sensing subsystem 112 to measure a surface temperature with thermal-sensing signal 113. Thermal-sensing subsystem 112 may generate temperature-control signal 114 for wavefront-generating subsystem 110 as part of a feedback-loop to help maintain the surface temperature at a predetermined temperature or within a predetermined temperature range. For example, thermal-sensing subsystem 112 may help maintain a surface temperature within a predetermined range depending on the application for which system 102 is being used. In some embodiments, a surface temperature of greater than 55 degrees Celsius may be maintained, although the scope of the invention is not limited in this respect. In embodiments, thermal-sensing subsystem 112 may use an infrared (IR) sensing technique to determine the temperature of a surface. In other embodiments, thermal-sensing subsystem 1112 may use optical or visual signals to determine when the temperature of surface 106 may be getting to hot (e.g., changing color to brown or black).

In some embodiments, wavefront-generating subsystem 110 may comprise an active antenna system to generate high-power wavefront 104, while in other embodiments, wavefront-generating subsystem 110 may comprise a passive antenna system to generate high-power wavefront 104. These embodiments are described in more detail below. The power level of high-power wavefront 104 may be changed (e.g., reduced or increased) in response to control signal 114 from thermal-sensing subsystem 112 to help maintain a surface temperature above, below, or within a predetermined temperature range. The system can use various methods to control the power density on surface 106 such as using an antenna system or lens to control the divergence angle of a radiated beam comprising wavefront 104.

In some embodiments, system 102 generates a pulsed high-power wavefront. In these embodiments, system 102 may change either a pulse-repetition-rate or a pulse-duration time of the transmitted wavefront in response to control signal 114.

The millimeter-wave frequency or frequencies for wavefront 104 may be selected depending on the application. In some embodiments, the frequency may be selected based on the molecular structure of surface 106. For example, the frequency may be selected based on the resonance of the molecules, such as water molecules. In embodiments, the millimeter-wave frequency may also be chosen so that the surface heating occurs primarily within surface depth 108 of surface 106.

In some embodiments, system 102 may be suitable for improved surface heating. In some embodiments, system 102 may be suitable for sterilizing a surface, browning food, drying and/or removing paint, cauterization of blood vessels, curing ceramic material, etc. In yet other embodiments, system 102 may be used for boiling off and/or removing a top layer of a liquid to remove impurities on the top, such as the removal of oil from the surface of water.

When used for paint removal (e.g., for the removal of lead paint), a painted surface may be heated until the paint softens and no longer adheres to the underlying surface allowing easier removal. Alternatively, when used for paint removal, the paint may be heated until it burns off before the underlying surface gets too hot. Some conventional paint removal techniques have used microwave energy, however these conventional techniques have required the addition of a microwave absorbing material to the painted surface to absorb the microwave energy and heat the paint. System 102, on the other hand, can directly heat a painted surface with a high-power millimeter-wave wavefront and does not require the addition of absorptive materials to the surface.

In some other embodiments, system 102 may be suitable for heating just below a surface within a predetermined surface depth. For example, system 102 may be used to heat and/or dry layers of wood timber just below the bark, possibly without heating the bark which is unlike conventional systems that use laser energy.

Figure 2:
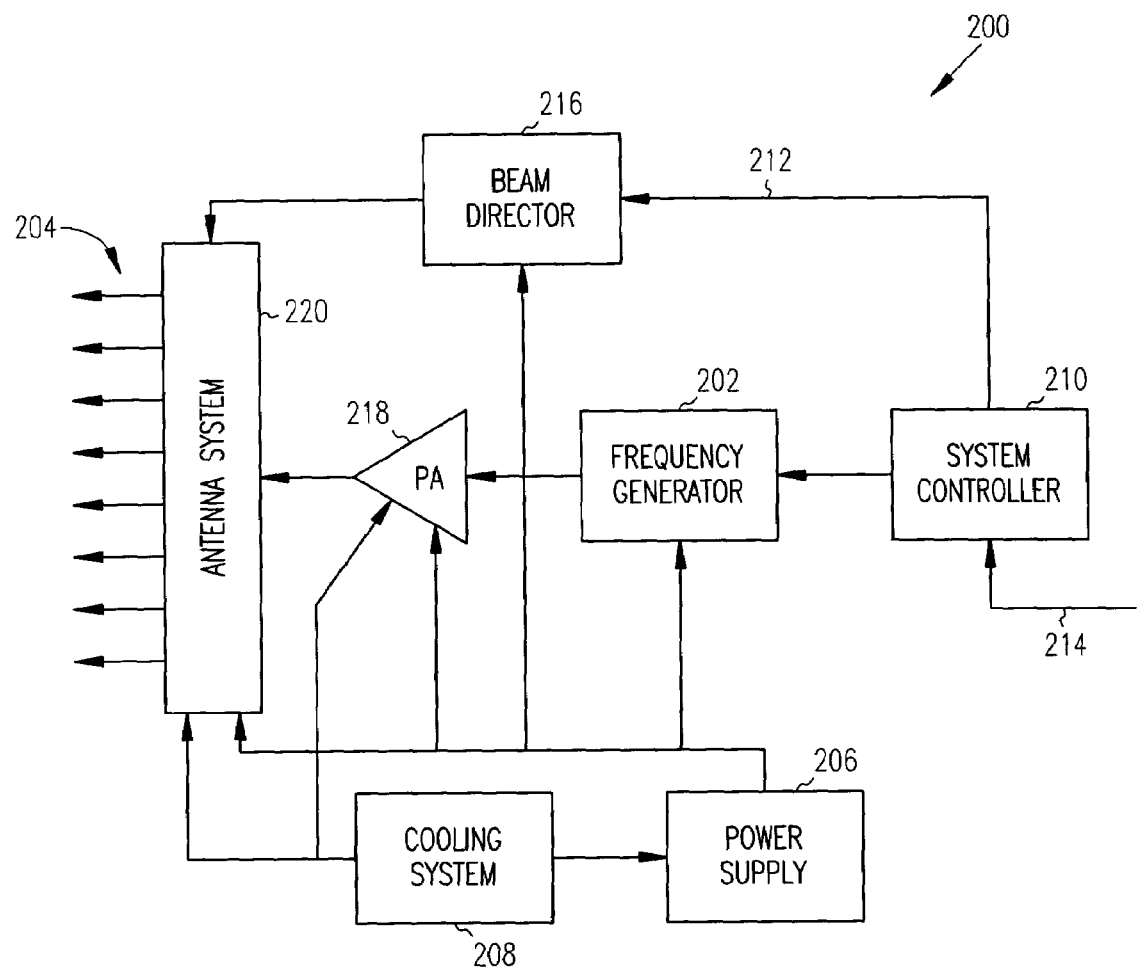
FIG. 2 is a functional block diagram of a wavefront-generating subsystem in accordance with some embodiments of the present invention.

FIG. 2 is a functional block diagram of a wavefront-generating subsystem in accordance with some embodiments of the present invention. Wavefront-generating subsystem 200 may be suitable for use as wavefront-generating subsystem 110 (FIG. 1), although other systems and subsystems may also be suitable. Wavefront-generating subsystem 200 includes antenna system 220 which generates high-power wavefront 204 at a millimeter-wave frequency. Wavefront-generating subsystem 200 may also comprise frequency generator 202 to generate the millimeter-wave frequency and power supply 206 to provide power for the various elements of subsystem 200. High-power wavefront 204 may be, for example, either in a collimated wavefront, a converging wavefront or a diverging wavefront.

In some embodiments, antenna system 220 may be a passive system which receives a high-power millimeter-wave frequency signal provided by frequency generator 202 and/or power amplifier 218. In these embodiments, frequency generator 202 and power amplifier 218 may comprise single or separate elements and may include a gyrotron, a traveling wave tube (TWT), and/or a klystron to generate a high-power millimeter-wave frequency signal for antenna system 220. In some embodiments, frequency generator 202 may generate a low-power millimeter-wave frequency signal, which may be amplified by power amplifier 218. In these embodiments, power amplifier 218 may comprise a high-power amplifier such as a traveling wave tube (TWT), or a klystron to generate the high-power millimeter-wave frequency signal for antenna system 220.

In other embodiments, antenna system 220 may be an active antenna system which receives a lower-power millimeter-wave frequency signal provided by frequency generator 202 and/or power amplifier 218. In these embodiments, frequency generator 202 and/or power amplifier 218 may comprise a crystal oscillator and/or semiconductor-based amplifier elements (e.g., transistor amplifiers) to generate the lower-power millimeter-wave frequency signal for antenna system 220. In these embodiments, antenna system 220 may amplify the lower-power millimeter-wave frequency signal to provide high-power wavefront 204.

Frequency generator 202 may utilize Gunn or Impatt diodes (e.g., on InP HEMP) to generate the millimeter-wave frequency signal, although other ways of generating and/or amplifying frequencies are also suitable. In some embodiments, power amplifier 218 is optional depending on the power level required by antenna system 220 and the power level provided by frequency generator 202.

Power supply 206 may include a low-voltage, high-current power supply capable of generating a high-surge current for antenna system 220. In these embodiments, power supply 206 may utilize large capacitors which can provide high-surge current as required by power amplifier 218, frequency generator 202 and/or antenna system 220.

Subsystem 200 may also include cooling subsystem 208 to reduce and/or control the temperature of elements of the subsystem, such as antenna system 220, frequency generator 202, power amplifier 208 and/or power supply 206. In some embodiments, cooling subsystem 208 may be a distributed system and may comprise one or more thermo-electric-cooling (TEC) elements, while in other embodiments cooling system 208 may incorporate a phase-change fluid, refrigerant, or coolant.

Subsystem 200 may also include system controller 210 which, among other things, may be responsive to signals 214 from other subsystems. For example, system controller 210 may receive temperature-control signal 114 (FIG. 1) from other subsystems, such as thermal-sensing subsystem 112 (FIG. 1), and may respond accordingly to increase or decrease the surface temperature.

In some embodiments, system 200 may include beam director 216. System controller 210 may generate beamforming control signals 212 to control beam director 216 to direct wavefront 204 in a particular direction, such as in the direction of a surface to be heated, although the scope of the invention is not limited in this respect. In this embodiment, antenna system 220 may be capable of directing wavefront 204, and may comprise a phased-array type of antenna although the scope of the invention is not limited in this respect. The inclusion of beam director 216 in system 200 may depend on the particular application for which system 200 is intended, as well as the particular type of antenna system used for antenna system 220.

In embodiments, the specific frequency of the millimeter-wave signal generated by frequency generator 202 and comprising wavefront 204 may be selected to increase a bond-resonance between atoms of the surface matter, such as water molecules (e.g., the hydrogen-to-oxygen bonds), resulting in surface heating of any surface. In embodiments, any millimeter-wave frequency (e.g., 30 to 300 GHz) may be suitable and in some embodiments, W-band frequencies (e.g., 77 to 110 GHz) may be particularly suitable, although the scope of the invention is not limited in this respect. A millimeter-wave frequency may also be chosen so that the heating occurs primarily within a predetermined surface depth, such as surface depth 108 (FIG. 1) of surface 106 (FIG. 1). In embodiments, the surface depth for the heating may, for example, be much less than a millimeter, although the scope of the invention is not limited in this respect.

In some embodiments antenna system 220 may emit wavefront 204 comprised of either single frequencies, different frequencies or broadband frequencies. In these embodiments, the use of multiple frequencies emitted together or at different times may be used to achieve a desired temperature profile as a function of time of a surface or within a surface depth of a surface. These embodiments may be suitable for heating a layered surface.

Those of ordinary skill in the art may choose appropriate power levels and associated system components for providing high-power wavefront 204 depending on distance and/or temperature requirements of subsystem 200. In some embodiments, system 200 may generate a predetermined power density at a distance of up to several meters and greater. In some embodiments, wavefront 204 may be a wavefront comprised of coherent RF energy to help reduce spreading, although the scope of the invention is not limited in this respect.

Although system 102 (FIG. 1) and subsystem 200 are illustrated as having several separate functional elements, one or more of the functional elements may be combined and may be implemented by combinations of software-configured elements, such as processing elements including digital signal processors (DSPs), and/or other hardware elements. For example, processing elements may comprise one or more microprocessors, DSPs, application specific integrated circuits (ASICs), and combinations of various hardware and logic circuitry for performing at least the functions described herein.

Figure 3:
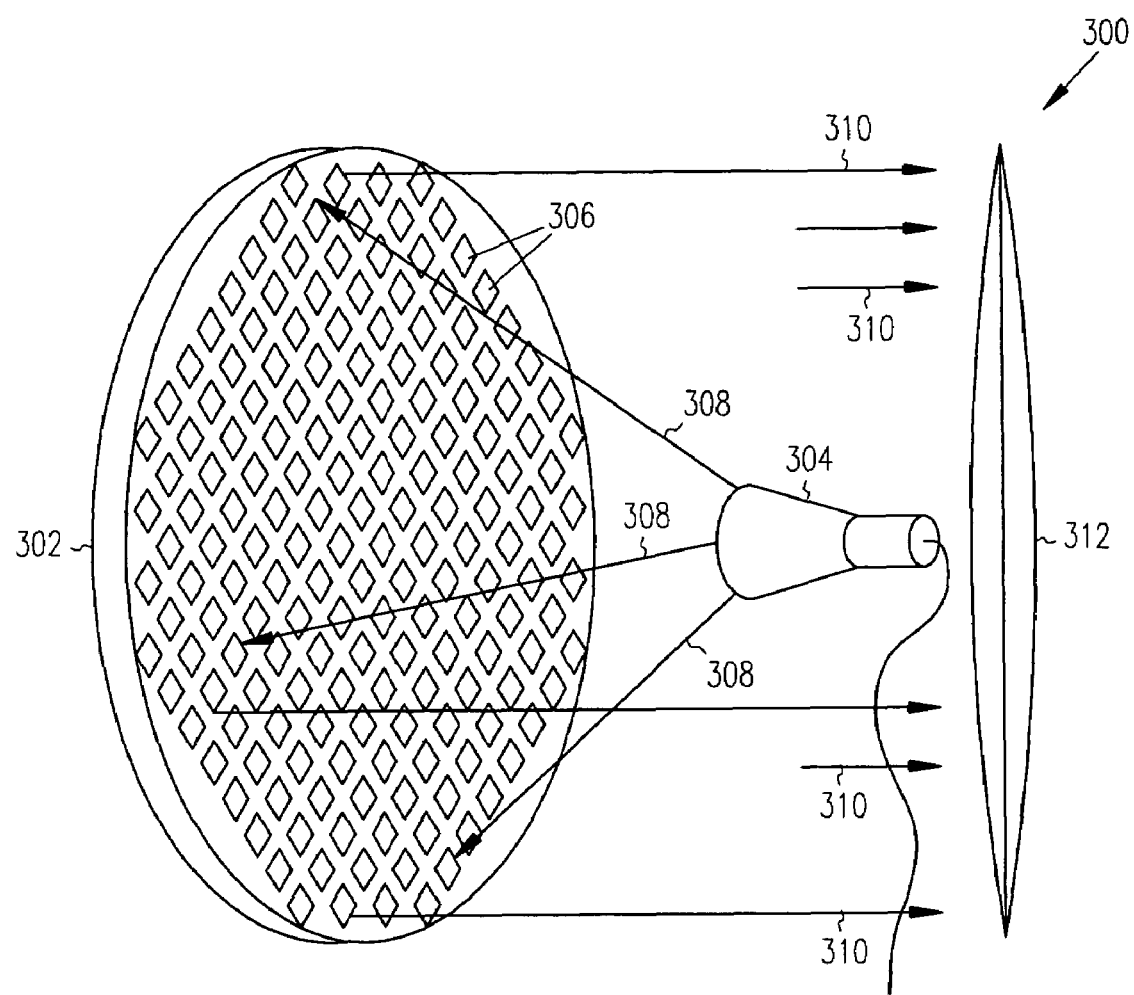
FIG. 3 illustrates an active-array antenna system in accordance with some embodiments of the present invention.

FIG. 3 illustrates an active-array antenna system in accordance with some embodiments of the present invention. Active-array antenna system 300 generates a high-power wavefront at a millimeter-wave frequency and may be suitable for use as antenna system 220 (FIG. 2) although other antennas and antenna systems may also be suitable. Active-array antenna system 300 may receive a lower-power millimeter-wave frequency signal from frequency generator 202 (FIG. 2) and/or power amplifier 218 (FIG. 2) for use in generating high-power wavefront 204 (FIG. 2).

In this embodiment, active-antenna system 300 includes active reflect-array 302 which may be spatially fed by low-power feed 304. Active reflect-array 302 may comprise a plurality of semiconductor wafers 306 (e.g., monolithic substrates) arranged or tiled together. In the illustrated embodiments, wafers 306 are tiled together in a substantially parabolic shape, although the scope of the invention is not limited in this respect. Low-power feed 304 may provide lower-power wavefront 308 at a millimeter-wave frequency for incident on active reflect-array 302. Wavefront 308 may be a substantially vertically-polarized wavefront, although this is not a requirement. In response to wavefront 308, active reflect-array 302 may generate high-power wavefront 310.

In embodiments, active reflect-array 302 may include a plurality of receive antennas to receive wavefront 308 from low-power feed 304, and may include a plurality of power amplifiers to amplify signals of the wavefront received by an associated one of the receive antennas. Active reflect-array 302 may also include a plurality of transmit antennas to transmit the amplified signals to provide high-power wavefront 310.

In embodiments, low-power feed 304 be a passive feed, such as a directional antenna, to provide wavefront 308 for incidence on active reflect-array 302. In another embodiment, feed 304 may comprise a passive reflector to reflect a millimeter-wave frequency and provide wavefront 308 for incidence on active reflect-array 302. In this embodiment, feed 304 may reflect a millimeter-wave signal transmitted by a feed which may be near the center of array 302, although the scope of the invention is not limited in this respect.

In some other embodiments, low-power feed 304 may be an active feed to coherently amplify and reflect a millimeter-wave frequency received from a source within (e.g., at or near the center) of active reflect-array 302, although the scope of the invention is not limited in this respect. In these embodiments, low-power feed 304 may comprise one or more receive antennas to receive the millimeter-wave frequency from the feed source, one or more amplifiers to amplify the received millimeter-wave frequency, and one or more transmit antennas to transmit the amplified signals and provide lower-power wavefront 308 for incidence on active reflect-array 302.

In yet other embodiments, low-power feed 304 may receive a signal from a signal source for transmission such frequency generator 202 (FIG. 2) and/or power amplifier 218 (FIG. 2). Alternatively, low-power feed 304 may include a frequency generator and a power amplifier, such frequency generator 202 (FIG. 2) and/or power amplifier 218 (FIG. 2), to generate the millimeter-wave frequency and generate wavefront 308.

Depending on the shape of active reflect-array 302, and the phasing, polarization and/or coherency of wavefront 308, (among other things), active reflect-array 302 may be configured to generate either a high-power collimated wavefront, or a high-power converging or diverging wavefront. In some embodiments, beamforming element 312 may be used to collimate, converge or diverge wavefront 310 depending on the desired outcome and the type of wavefront generated by array 302. In some embodiments, beamforming element 312 may be an RF lens or a Fresnel type lens, although the scope of the invention is not limited in this respect.

In other embodiments, low-power feed 304 may be a passive source. In these embodiments, feed 304 may be implemented as a passive partly-reflecting plate element to provide a wavefront emission (e.g., wavefront 308) to reflect array 302. In these embodiments, the wavefront emission may actually be part of the wavefront emission (e.g., wavefront 310) that is reflected back. In these embodiments, millimeter-wave frequencies may be generated with the natural and/or induced oscillations of individual semiconductor wafers 306 of a passive reflect array in place of active reflect-array 302. In one embodiment, a passive low power feed (e.g., feed 304) may be the source and may be used together with a beamforming element (in the path of wavefront 308), to reflect into a partly reflecting single plate element. In these embodiments, the spacing between monolithic array 302 and the partly reflecting element resulting from the combination of passive source 304 and beam forming element 312 may control the final output frequency radiated as wavefront 310. In these embodiments, active-array system 300 may have its output radiative emission generated by this level of the system without the necessity of other low-level sources, such as frequency generator 202 (FIG. 2). In these embodiments, the shape of the combined partly reflecting elements (e.g., 304 and 312) may control the phase of the individual semiconductor wafers 306 to allow the final beam (e.g., wavefront 310) to have a desired phase front. Control of phase constants between some key elements of the active reflect-array 302 or by physically or electrically shifting the low-power feed element may provide for more optimal distributions or direction-steering capabilities of wavefront 310.

Figure 4:
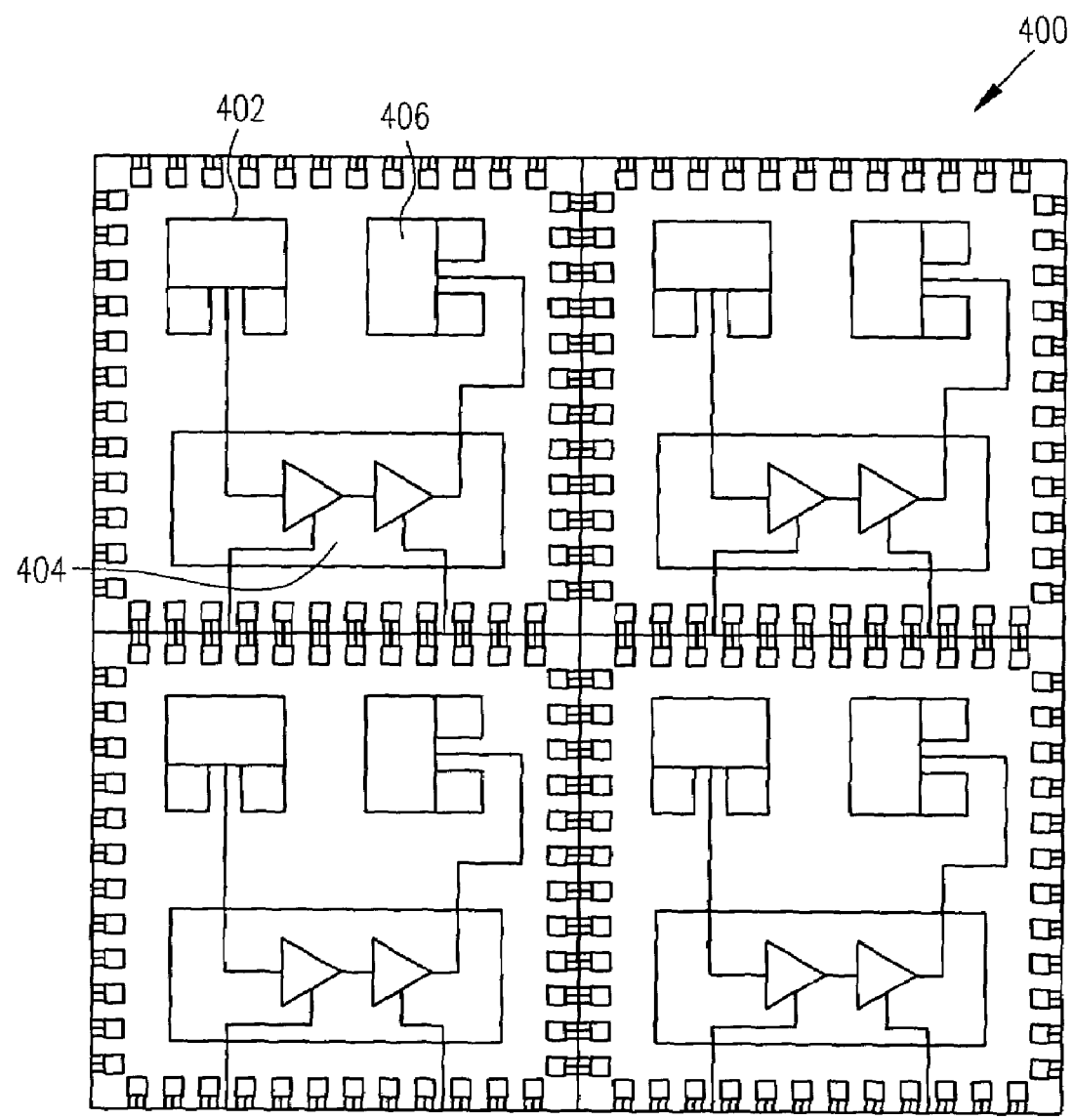
FIG. 4 illustrates a portion of a semiconductor wafer suitable for use as part of an active reflect-array in accordance with some embodiments of the present invention.

FIG. 4 illustrates a portion of a semiconductor wafer suitable for use as part of an active reflect-array, such as active reflect-array 302 (FIG. 3) in accordance with some embodiments of the present invention. Portion 400 may be suitable for wafers 306 (FIG. 3) although other semiconductor wafers may also be suitable. Semiconductor wafer portion 400 may include one or more receive antennas 402 to receive a wavefront, such as wavefront 308 (FIG. 3) which may be a substantially vertically-polarized wavefront. Portion 400 may also include one or more sets of power amplifiers 404 to amplify signals of the wavefront received by an associated one of receive antennas 402. Portion 400 may also include one or more transmit antennas 406 to transmit the amplified signals to generate a high-power wavefront, such as wavefront 310 (FIG. 3) at a millimeter-wave frequency. In embodiments, each set of power amplifiers 404 may be associated with one of the transmit and one of the receive antennas. In some embodiments, portion 400 may include separate receive and transmit antennas, while in other embodiments, amplification elements may utilize a single antenna for receiving and transmitting.

In embodiments, antennas 402 and 406 may be patch antennas; however other antennas such as a dipole antenna, a monopole antenna, a loop antenna, a microstrip antenna or other type of antenna suitable for reception and/or transmission of millimeter-wave signals may also be suitable. In one embodiment, a dual-polarized patch antenna may be used for both transmit and receive functions.

Examples of active-reflect array antennas which may be suitable for use as active-array antenna system 300 (FIG. 3) and semiconductor wafer portion 400 are described in U.S. patent application Ser. No. 10/153,140, entitled "MONOLITHIC MILLIMETER-WAVE REFLECT ARRAY SYSTEM", having a file date of May 20, 2002, and assigned to same assignee as the present invention. The U.S. Patent Application is hereby incorporated by reference.

Figure 5:
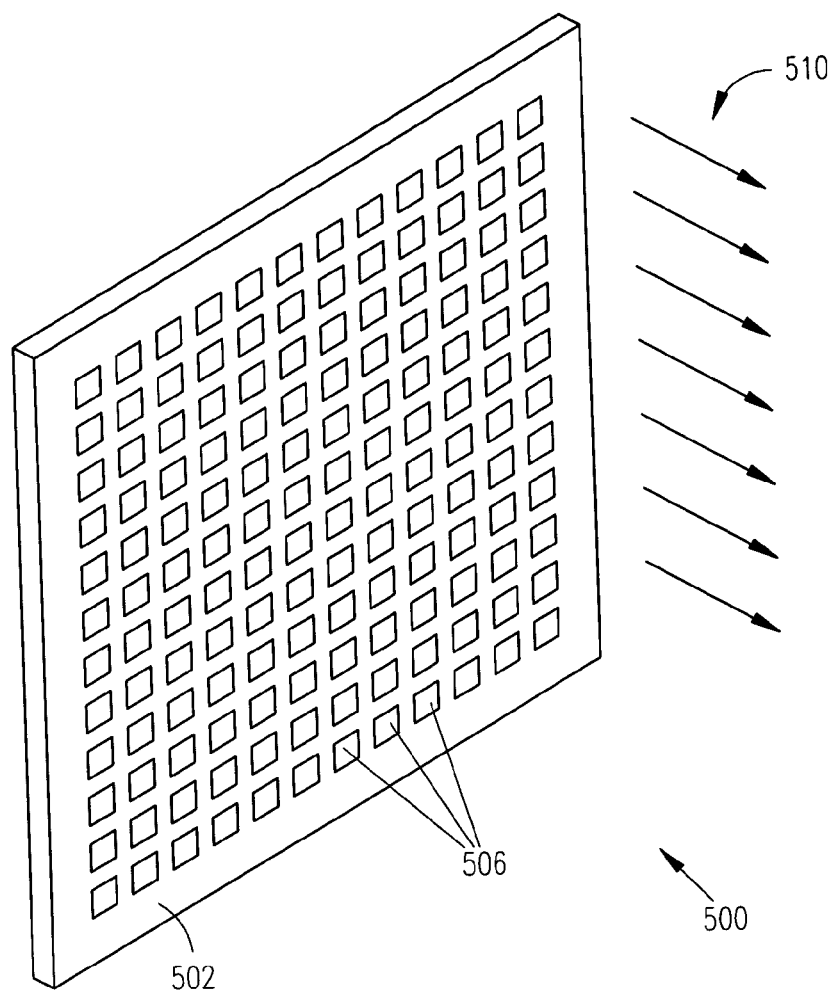
FIG. 5 illustrates a planar active-array antenna system in accordance with some embodiments of the present invention.

FIG. 5 illustrates a planar active-array antenna system in accordance with some embodiments of the present invention. Active-array antenna system 500 generates high-power wavefront 510 at a millimeter-wave frequency and may be suitable for use as antenna system 220 (FIG. 2) although other antennas may also be suitable. Active-array antenna system 500 may receive a lower-power millimeter-wave frequency signal from frequency generator 202 (FIG. 2) and/or power amplifier 218 (FIG. 2) for use in generating high-power wavefront 510.

In some embodiments, antenna system 500 may include substantially flat structural element 502 having a plurality of semiconductor wafers 506 (e.g., monolithic substrates) arranged therein or tiled together in a substantially flat shape. Each of semiconductor wafers 506 may comprise one or more sets of power amplifiers to amplify the millimeter-wave frequency, and one or more transmit antennas to generate high-power wavefront 510 at the millimeter-wave frequency. Each set of power amplifiers may be associated with one of the transmit antennas. In this embodiment, wafers 506 of planar active-array antenna system 500 may be fed with one or more millimeter-wave signals from a signal source (not shown) for amplification and transmission. In some embodiments, array antenna system 500 may comprise a single monolithic semiconductor substrate, rather than many wafers 506 tiled together.

Active-array antenna system 500 may be configured to generate either a high-power collimated wavefront, or a high-power converging or diverging wavefront depending on factors such as coherency, phasing and/or polarization. In some embodiments, a separate beamforming element may be used to collimate, converge or diverge wavefront 510 depending on the desired outcome and the type of wavefront desired to be generated by antenna system 500. In some embodiments, the additional beamforming element may be an RF lens, although the scope of the invention is not limited in this respect. In some embodiments, the direction of wavefront 510 may be controlled by a beam director, such as beam director 216 (FIG. 2).

Figure 6:
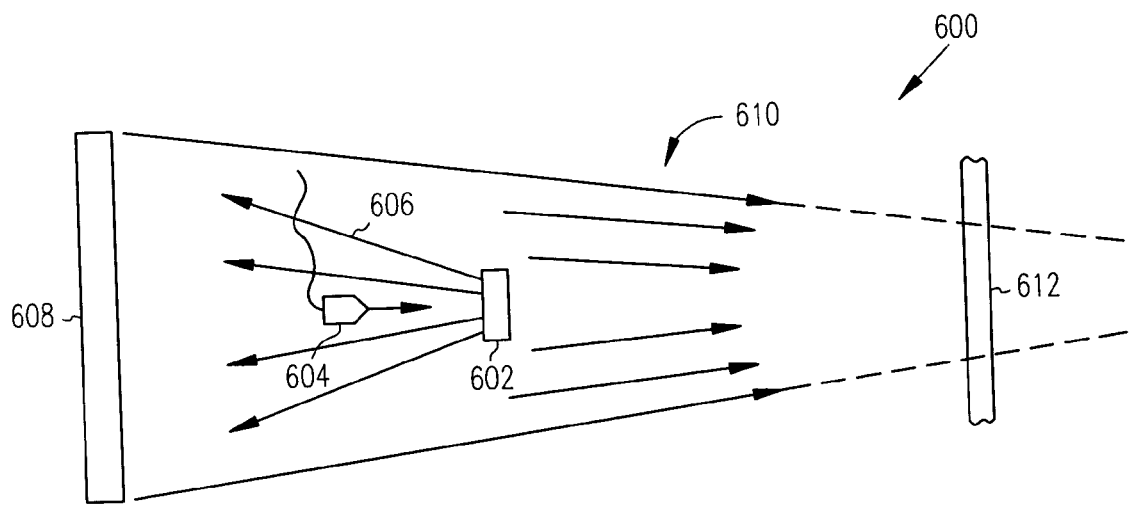
FIG. 6 illustrates a side view of a passive reflect-array antenna system in accordance with some other embodiments of the present invention.

FIG. 6 illustrates a side view of a passive reflect-array antenna system in accordance with some other embodiments of the present invention. Passive reflect-array antenna system 600 generates high-power wavefront 610 at a millimeter-wave frequency and may be suitable for use as antenna system 220 (FIG. 2) although other antennas may also be suitable. Passive reflect-array antenna system 600 may receive a high-power millimeter-wave frequency signal from frequency generator 202 (FIG. 2) and/or power amplifier 218 (FIG. 2) for use in generating high-power wavefront 610.

Antenna system 600 includes passive reflector 602 which may reflect a millimeter-wave frequency signal received from signal source 604. Reflector 602 may provide wavefront 606 for incidence on passive reflect antenna 608. Wavefront 606 may be a high-power vertically-polarized wavefront and reflector 602 may be flat circular metallic element. Passive reflect antenna 608 may be spatially fed and may include a plurality of antennas to receive wavefront 606 and provide high-power wavefront 610. In some embodiments, high-power wavefront 610 may be a converging or diverging wavefront which may converge at or near surface 612 to be heated. In some other embodiments, high-power wavefront 610 may be a collimated wavefront. In embodiments in which a high-power converging-conical wavefront is generated, the spacing between reflector 602 and reflect antenna 608 may be changed to change the convergence point of the wavefront 610 (e.g., near a location of an apex of a cone).

Passive reflect antenna 608 may have a flat or parabolic shape and may comprise a plurality of individual antenna elements, such as dual-polarized dipoles of differing sizes, arranged circumferentially around a center point. In this embodiment, each antenna element may receive and transmit and may provide approximately a 180 degree phase shift, although the scope of the invention is not limited in this respect. The antenna elements may have varying sizes and shapes to receive wavefront 606 and generate wavefront 610. An example of one type of antenna suitable for use as passive reflect antenna 608 is the flat parabolic surface reflector antenna by Malibu Research of Calabasas, Calif., although other passive reflect antennas may also be suitable. Although reflector 602 and feed 604 are illustrated as being located or positioned within wavefront 610, reflector 602 and feed 604 may actually be positioned below or to the side so as to at least partially avoid wavefront 610.

In some embodiments, reflector 602, feed 604, reflect antenna 608 and other system components may be mounted or located on a tripod or other transportable device. These embodiments, along with the changing of the focus distance, may allow wavefront 610 to be directed and focused at almost any surface or any thing.

Figure 7:
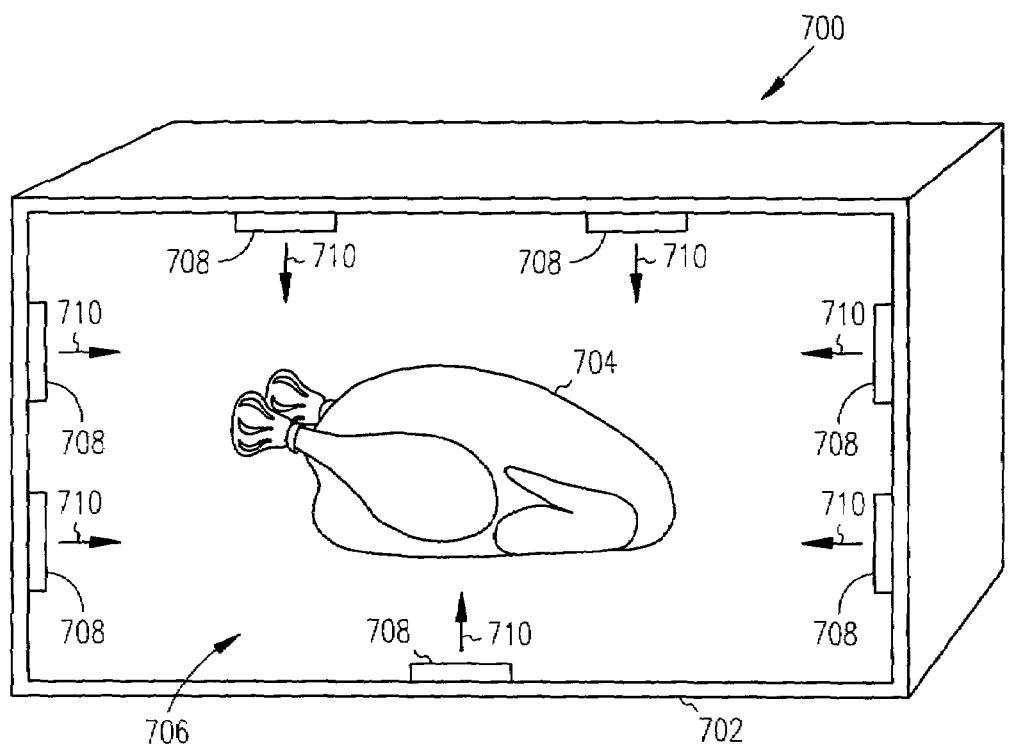
FIG. 7 illustrates a surface-heating system in accordance with an embodiment of the present invention.

FIG. 7 illustrates a surface-heating system in accordance with an embodiment of the present invention. For example, surface-heating system 700 may be suitable for use as a system for heating the surface of and/or browning the surface of a food item, although other uses of system 700 are within the scope of the present invention. Portions of system 700 may correspond with the elements of wavefront-generating subsystem 200 (FIG. 2). In embodiments, system 700 may be a system for browning food and/or cooking food and may comprise housing 702 having cavity 706 for placement of item 704. System 700 may also comprise one or more antenna systems 708.

In some embodiments, antenna system 500 (FIG. 5) may be suitable for use as one or more of antenna systems 708, although antenna system 300 (FIG. 3) or antenna system 600 (FIG. 6) may also be suitable. Antenna systems 708 may be mounted within housing 702 and arranged within cavity 706 to direct one or more high-power wavefronts 710 within the cavity to heat and/or brown a surface of item 704. High-power wavefronts 710 may be either collimated wavefronts, converging, and/or diverting wavefronts depending on the antenna system selected for use as antenna systems 708.

In embodiments, antenna systems 708 may direct high-power wavefronts 710 within cavity 706 in a direction of item 704. In the case of converging-conical wavefronts, the apex of the cone may be near the center of cavity 706, although the scope of the invention is not limited in this respect.

In some embodiments antenna systems 708 may emit either single frequencies, different frequencies or broadband frequencies. In these embodiments, the use of multiple frequencies either at the same or at different times may be used to achieve the desired temperature profile as a function of time. These embodiments may be suitable for heating layers when item 704 is layered.

In some embodiments, system 700 may include a thermal-sensing subsystem, such as thermal sensing subsystem 112 (FIG. 1) to measure a surface temperature of item 704 and generate a control signal to maintain the surface temperature substantially within a predetermined temperature range. In some embodiments, the surface temperature may be maintained within a predetermined range for a predetermined time or until the surface is browned, which may be determined by the thermal sensing subsystem.

In some embodiments, system 700 may be part of a microwave oven. In these embodiments, in additional to the surface heating and browning features discussed above, system 700 may include a microwave amplifier and associated antenna to direct microwave energy within the cavity to heat and/or cook the item at or below its surface. In these embodiments, system 700 may include other elements associated with a conventional microwave oven although the scope of the invention is not limited in this respect.

When used for browning food, system 700 may brown the outer layers of a food item, and may be used to brown food items while the item is inside paper or plastic wrapping. In cooking, it has been demonstrated that millimeter-wave RF radiation browns outer layers of food which is unlike conventional microwave ovens that operate at lower frequencies (e.g., 2.48 GHz or 0.915 GHz). The energy used in a conventional microwave oven penetrates the food too deeply and does not brown the outer layers of food.

Figure 8:
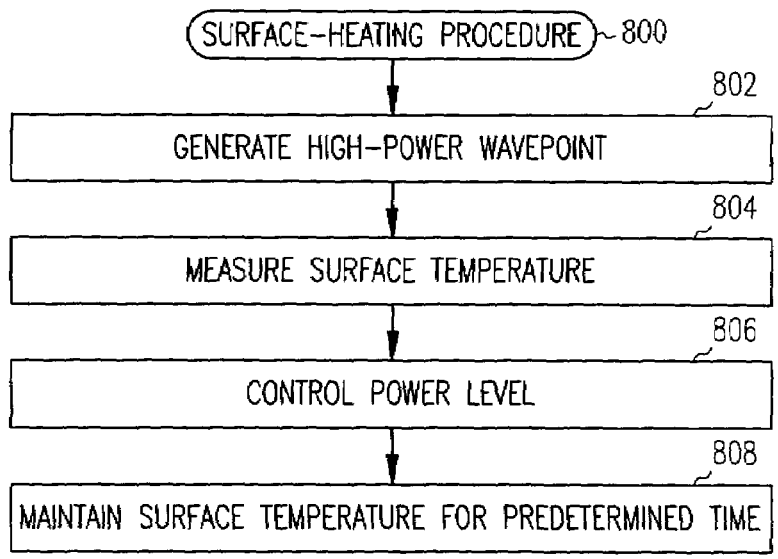
FIG. 8 is a surface-heating procedure in accordance with some embodiments of the present invention.

FIG. 8 is a surface-heating procedure in accordance with some embodiments of the present invention. Surface-heating procedure 800 may be performed by surface-heating system 102 (FIG. 1) and/or wavefront-generating subsystem 200 (FIG. 2) although other systems may perform procedure 800. Operation 802 generates a high-power wavefront which may be directed at a surface to be heated. Operation 802 may be performed by antenna system 220 (FIG. 2). Operation 804 measures the surface temperature. Operation 804 may be performed by thermal-sensing subsystem 112 (FIG. 1). Operation 806 may control the power level, pulse repetition rate, size of the field of regard of the emitted wavefront, position of the emitted wavefront, frequency of emission or duration of the wavefront being generated in operation 802 to maintain the surface temperature within a predetermined temperature range or at a predetermined temperature. Operation 808 may maintain the surface temperature for a predetermined time, for example, for sterilization, browning or other purposes.

Although the individual operations of procedure 800 are illustrated and described as separate operations, one or more of the individual operations may be performed concurrently and nothing requires that the operations be performed in the order illustrated. In accordance with some embodiments of the present invention, some operations of procedure 800 are optional. For example, in some embodiments, operation 808 may be optional, while in other embodiments, operation 804 and/or 806 may be optional.

It is emphasized that the Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features that are expressly recited in each claim. Rather, as the following claims reflect, inventive subject matter lies in less than all features of a single disclosed embodiment. Thus the following claims are hereby incorporated into the detailed description, with each claim standing on its own as a separate preferred embodiment.

What is claimed is:

1. A surface-heating system comprising:
    an active reflect-array antenna system to provide a collimated high-power wavefront at a millimeter-wave frequency in a direction of a surface to heat the surface within a surface depth by amplifying and reflecting a spatially-fed millimeter-wave lower-power wavefront; and
    a low-power feed to provide the spatially-fed millimeter-wave lower-power wavefront for incident on the active reflect-arrays,
    wherein the active reflect-array antenna system comprises a plurality of individual semiconductor wafers arranged together on a surface, each wafer configured to receive, amplify and retransmit.

2. A surface-heating system comprising:
    an active reflect-array antenna system to provide a collimated high-power wavefront at a millimeter-wave frequency in a direction of a surface to heat the surface within a surface depth by amplifying and reflecting a spatially-fed millimeter-wave lower-power wavefront; and a low-power feed to provide the spatially-fed millimeter-wave lower-power wavefront for incident on the active reflect-array, wherein the active reflect-array antenna system comprises a plurality of individual semiconductor wafers arranged together on a surface, wherein each semiconductor wafer comprises:

a receive antenna to receive signals of the spatially-fed millimeter-wave lower-power wavefront;

a set of power amplifiers coupled to the receive antenna to amplify the received signals; and a transmit antennae to transmit amplified millimeter-wave signals, wherein the amplified millimeter-wave signals transmitted by the transmit antennas of each semiconductor wafer spatially combine to generate the collimated high-power wavefront.

3. The system of claim 2 wherein the plurality of semiconductor wafers is arranged in a substantially parabolic shape.

4. The system of claim 2 further comprising a frequency generator to generate the millimeter-wave frequency and provide the millimeter-wave frequency to the low-power feed, wherein the frequency generator and the active reflect-array antenna system are part of a wavefront-generating subsystem, the system further comprising a thermal-sensing subsystem to measure a surface temperature and generate a control signal for the wavefront-generating subsystem to control the surface temperature.

5. The system of claim 4 wherein the active reflect-array antenna system generates a continuous-wave wavefront, and wherein the antenna system changes a transmit power level of the wavefront in response to the control signal from the thermal-sensing subsystem to control the surface temperature.

6. The system of claim 4 wherein the active reflect-array antenna system generates a pulsed high-power wavefront, and wherein the antenna system reduces one of either a pulse-repetition-rate or a pulse-duration time of the high-power wavefront in response to the control signal to control the surface temperature.

7. The system of claim 2 further comprising a housing having a cavity for placement of a food item, and wherein the active reflect-array antenna system is one of a plurality of active reflect-array antenna systems positioned within the cavity to direct a plurality of high-power millimeter-wave wavefronts within the cavity to heat a surface of the food item.

8. The system of claim 7 further comprising a microwave amplifier and associated antenna to direct microwave energy within the cavity to heat the food item below the surface.

9. The system of claim 2 wherein the low-power feed comprises a passive reflector to reflect a millimeter-wave frequency signal from a feed and provide the lower-power wavefront for incident on the active reflect-array antenna system.

10. The system of claim 2 wherein the plurality of semiconductor wafers is arranged on a substantially flat surface.

11. The system of claim 2 further comprising a low-voltage, high-current power supply to generate current for the active reflect-array antenna system and a frequency generator; and a cooling subsystem to cool the active reflect-array antenna system and the power supply, wherein the cooling system comprises one of either a thermo-electric-cooling (TEC) element, a phase change fluid, or coolant.

12. The system of claim 4 wherein the frequency generator is configured to generate a plurality of differing millimeter-wave frequencies, wherein the active reflect-array antenna system provides the high-power wavefront comprising the differing millimeter-wave frequencies, and wherein the system further comprises a system controller to control a frequency and power level of the wavefront to selectively heat layers of the surface.

13. The system of claim 12 wherein the high-power wavefront is time-multiplexed with differing millimeter-wave frequencies.

14. A surface-heating system comprising:

an active reflect-array antenna system to provide a collimated high-power wavefront at a millimeter-wave frequency in a direction of a surface to heat the surface within a surface depth by amplifying and reflecting a spatially-fed millimeter-wave lower-power wavefront; and a low-power feed to provide the spatially-fed millimeter-wave lower-power wavefront for incident on the active reflect-array, wherein the active reflect-array antenna system is a first active reflect-array antenna system and the low-power feed is a second active reflect-array antenna system, wherein the low-power feed amplifies and reflects millimeter-wave signals received from a source located within of the first active reflect-array antenna system, the low-power feed comprising:

one or more receive antennas to receive the millimeter-wave signals from the source;

one or more amplifiers to amplify the received millimeter-wave frequency signals; and one or more transmit antennas to transmit the amplified millimeter-wave signals and generate the lower-power wavefront for incidence on the first active reflect-array antenna system.

* * * * *

UNITED STATES PATENT AND TRADEMARK OFFICE
CERTIFICATE OF CORRECTION

PATENT NO.        : 7,498,549 B2
APPLICATION NO.   : 10/693125
DATED             : March 3, 2009
INVENTOR(S)       : Gallivan et al.

It is certified that error appears in the above-identified patent and that said Letters Patent is hereby corrected as shown below:

In column 3, line 1, delete "1112" and insert -- 112 --, therefor.

In column 10, line 59, in Claim 1, delete "arrays," and insert -- array, --, therefor.

In column 11, line 15, in Claim 2, delete "antennae" and insert -- antenna --, therefor.

Signed and Sealed this

Second Day of June, 2009

JOHN DOLL
*Acting Director of the United States Patent and Trademark Office*